(12) United States Patent
Suzuki et al.

(10) Patent No.: US 7,436,276 B2
(45) Date of Patent: Oct. 14, 2008

(54) TUNING CIRCUIT PREVENTING A DETERIORATION OF Q VALUE

(75) Inventors: Takeo Suzuki, Fukushima-ken (JP); Shigeru Osada, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 286 days.

(21) Appl. No.: 11/481,703

(22) Filed: Jul. 5, 2006

(65) Prior Publication Data
US 2007/0052865 A1    Mar. 8, 2007

(30) Foreign Application Priority Data
Sep. 2, 2005  (JP) ............................. 2005-254362

(51) Int. Cl.
*H03J 3/20* (2006.01)
(52) U.S. Cl. .......................................... 334/55; 334/78
(58) Field of Classification Search ............. 334/55–60, 334/78
See application file for complete search history.

(56) References Cited

U.S. PATENT DOCUMENTS 3,526,859 A * 9/1970 Putzer ........................ 334/15
5,565,779 A * 10/1996 Arakawa et al. ............ 324/318
2005/0212610 A1 * 9/2005 Brekelmans ............. 331/117 R
2005/0261797 A1 * 11/2005 Cyr et al. ..................... 700/121
2006/0071726 A1 * 4/2006 Matsuo et al. .......... 331/117 R
2007/0075798 A1 * 4/2007 Amano ........................ 331/167

FOREIGN PATENT DOCUMENTS

JP    2000-156648    6/2000
JP    2003-309777    10/2003

* cited by examiner

*Primary Examiner*—Don P Le
(74) *Attorney, Agent, or Firm*—Beyer Law Group LLP

(57) ABSTRACT

A tuning circuit comprises, at least, a first circuit K1 which serially connects a first variable capacitor element 21a and a second variable capacitor element 31a, an inductance element 23a which is parallely connected to the first circuit K1 and constitutes a resonance circuit with the first circuit K1; a second circuit K2 which includes a switch element 26a and a third resistor 27a serially connected to each other and is parallely connected to the first circuit K1; and a first resistor 24a and a second resistor and 25a which are connected to both ends of the first variable capacitor element 21a, respectively and apply a predetermined tuning voltage.

7 Claims, 2 Drawing Sheets

TUNING CIRCUIT PREVENTING A DETERIORATION OF Q VALUE

FIELD OF THE INVENTION

The present invention relates to a tuning circuit installed in a television tuner, and more particularly to a tuning circuit which can prevent a deterioration of Q value and improve an RF characteristic.

DESCRIPTION OF THE RELATED ART

As a prior art of the present invention, there is exemplified JP-A-2003-309777 described below.

As shown in JP-A-2003-309777, a conventional television tuner comprises a band switching-type input tuning circuit 1 which is adapted to tuned to a low band or a high band of VHF band, a high frequency amplifying circuit 2 and an interstage tuning circuit 3.

The interstage tuning circuit 3 is constructed by a double tuning circuit, and includes a (parallel) resonance circuit whose primary and secondary portions comprise inductance elements 3a and 3c, and capacitors and varactor diodes 3b and 3d, respectively. A part of each of the inductance elements 3a and 3c is short-circuited by switch means 3e and 3f formed with a switch diode, etc., and thereby is switched so as to tune to television signals of a low band or a high band of VHF band. In other words, when the switch means 3e and 3f are switched to ON-state, a television signal of a high band of high frequency can be selected, and when switched to OFF-state, a television signal of a low band of low-frequency can be selected.

Further, a tuning voltage Vt for setting a tuning frequency is applied to a cathode of the varactor diode 3b and 3d.

Accordingly, since a resonance frequency f of the resonance circuit is defined by a formula $f=(1/2p\sqrt{L \cdot C})$, the tuning circuit can tune to the high band of high frequency by reducing values of the inductance elements.

Since the tuning circuit is the parallel resonance circuit, a Q value of the parallel resonance circuit is proportional to the inductance element value L ($Q \propto L$). Further, a bandwidth BW is inversely proportional to the Q value (Bw=f2−f1=∝1/Q). Therefore, when the inductance element value decreases, the Q value decreases but the bandwidth BW increases.

In such a configuration, when the tuning circuit tunes to the ON-state high band of high frequency, the switch diode is switched to ON-state, and the value of the inductance element is reduced. Therefore, on the basis of above-principle, the bandwidth BW is widened at the time of high band tuning operation.

Meanwhile in the conventional tuning circuit, the techniques for short-circuiting a midpoint of the inductance element by the switch diode (switch means) has been used. However, the switch diode has an ON-resistance $R_{DS}$ of from dozens of mo to hundreds of mo even at the time of conduction (ON). In this case, the ON-resistance $R_{DS}$ is generated in a form of directly connecting with the inductance element. Accordingly, the parallel resonance circuit has a configuration in which a series circuit consisting of the inductance element and the ON-resistance $R_{DS}$ is connected in parallel to a capacitor element consisting of the varactor diode, etc. The ON-resistance $R_{DS}$ is known that it lowers the Q value of the resonance circuit and make the bandwidth of the tuning circuit to be widened.

In other words, in the conventional tuning circuit, at the time of high band tuning operation, the bandwidth BW is widened by the principle cause. Further, since the ON-resistance is large when the switch diode is ON, the bandwidth BW is widened by the reduction of the value of Q. As a result, there has been a problem that an RF characteristic of the tuning circuit is easily deteriorated as the tuning frequency is increased.

SUMMARY OF THE INVENTION

The present invention has been proposed to solve the above problems, and it is an object of the present invention to provide a tuning circuit for improving an RF characteristic by preventing a deterioration of a Q value.

The invention comprises, at least, a first circuit which serially connects a first variable capacitor element and a second variable capacitor element, an inductance element which is parallely connected to the first circuit and constitutes a resonance circuit with the first circuit, a second circuit which includes a switch element and a third resistor serially connected to each other and is parallely connected to the first circuit, and a first resistor and a second resistor which are connected to both ends of the first variable capacitor element respectively and apply a predetermined tuning voltage.

In the invention, since a resonance circuit constituting the tuning circuit is not affected by an ON-resistor having the FET or the switch diode provided in circuits constituting those of the resonance circuit and the tuning circuit, a reduction of the Q value of the tuning circuit can be prevented. Thus, regardless of frequency bands, the RF characteristic can be improved by tuning the frequency in a constant bandwidth.

In the invention, a tuning control circuit is preferably provided that corrects variation in the resonance circuit elements by varying the voltage applied to one end of the second variable capacitor element.

Accordingly, the frequency of the resonance circuit constituting the tuning circuit can finely tune to a predetermined frequency. For this reason, even if the resonance circuit consists of the element having some errors, because such errors can be absorbed, the tuning circuit can tune to the predetermined frequency.

In the invention, the first resistor and the second resistor have the same resistance values.

Accordingly, the band switching in the resonance circuit and a variety of channel tuning of the respective bands are performed by using a common voltage (tuning voltage).

In the invention, it is preferable that the variable capacitor element is the variable capacitor diode.

Accordingly, since the band switching is performed by varying an applied voltage on an anode side of a variable capacitor diode constituting the first variable capacitor element, the frequency of the tuning circuit can be finely tuned by varying an applied voltage on an anode side of a variable capacitor diode forming the second variable capacitor element.

In the invention, it is preferable that the switch element is a MOS-type FET or a bipolar-type transistor.

Accordingly, since the tuning circuit can be formed with a simple structure, the reduction in manufacturing cost and the miniaturization of the circuit are achieved.

For example, the tuning control circuit is constructed by a fourth resistor connected in parallel to the capacitor, a plurality of voltage control circuits formed by parallely connecting switch elements and control resistors different from every circuit, and a fifth resistor applying a predetermined voltage to connection points of the second variable capacitor element and the fourth resistor and the plurality of voltage control circuits.

Accordingly, a potential of the anode of the second variable capacitor diode can be adjusted at plural steps. Thus, setting of the resonance circuit frequency can be more finely adjusted.

In the invention, a switching operation of the respective switching elements provided in the plurality of voltage control circuits is performed by a control signal of a predetermined bit number.

Accordingly, since the control signal may be digitalized, the tuning circuit is possibly controlled on the basis of, for example, a direct instruction from the control means.

In the invention, the reduction of the Q value is prevented by the ON-resistor of the switch element.

Further, since the wideness of the bandwidth can be prevented, the RF characteristic of the tuning circuit is possibly improved.

DESCRIPTION OF THE PREFERRED EMBODIMENT

The embodiments of the present invention will be described in detail with reference to the accompanying drawings.

Figure 1:
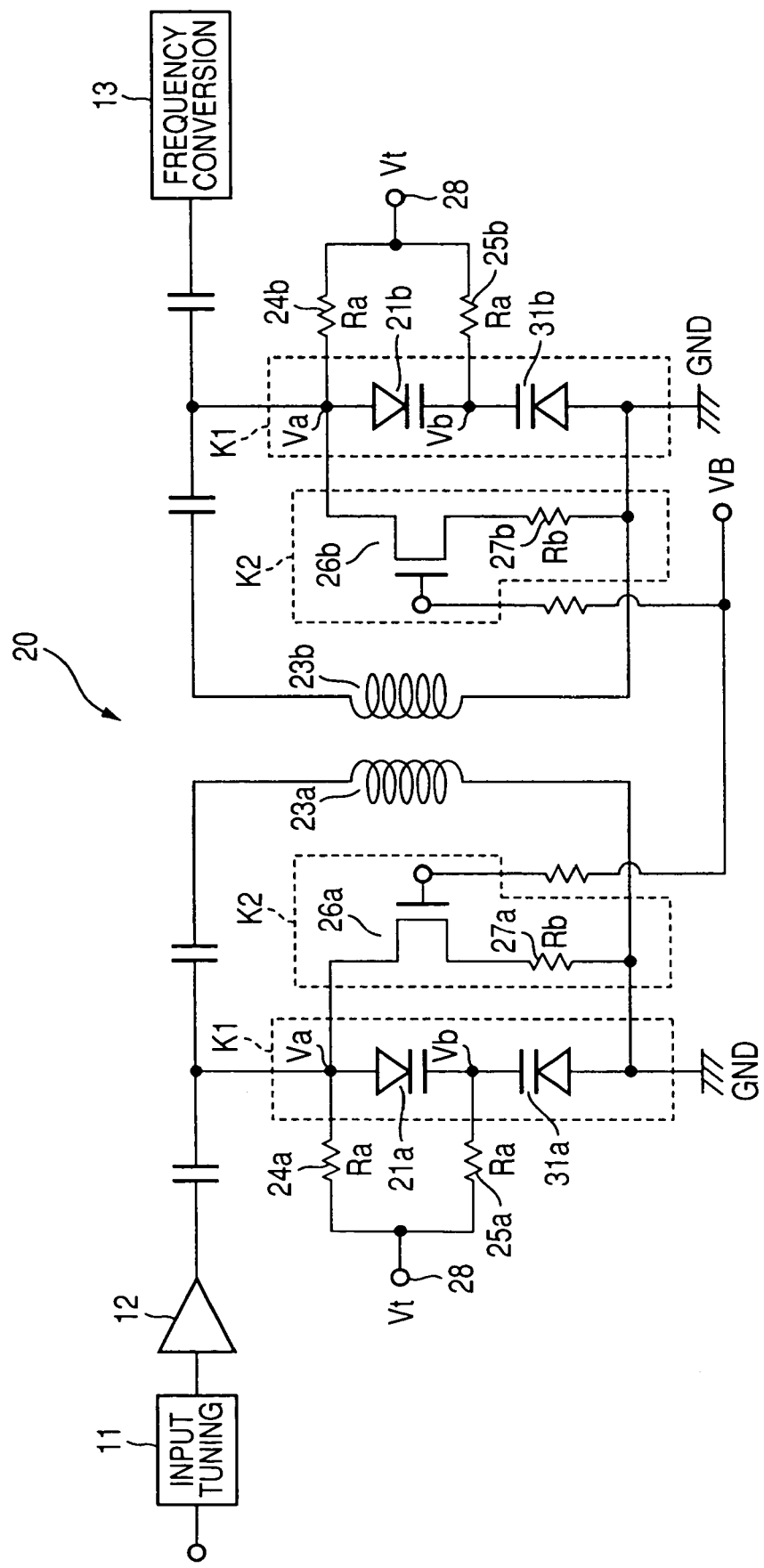
FIG. 1 is a circuit diagram schematically showing a television tuner having a tuning circuit of a first embodiment of the present invention.

FIG. 1 is a circuit diagram schematically showing a television tuner having a tuning circuit of a first embodiment of the present invention.

As shown in FIG. 1, the television tuner includes a band switching-type input tuning circuit 11 which is adapted to tune to a low band or a high band of VHF band and a high frequency amplifying circuit 12 provided at the next stage of the band switching-type input tuning circuit 11. Further, an interstage tuning circuit 20, which is the tuning circuit of the invention, is provided at the next stage of the high frequency amplifying circuit 12, and a frequency conversion circuit 13 consisting of a mixing circuit is provided at the rear stage of the interstage tuning circuit 20. Moreover, direct current cutting capacitors are provided between the high frequency amplifying circuit 12 and the interstage tuning circuit 20, and between the interstage tuning circuit 20 and the frequency conversion circuit 1.

The interstage tuning circuit 20 is constituted by a double tuning circuit consisting of a primary circuit at the right in FIG. 1 and a secondary circuit on the left in FIG. 1. Further, since the primary circuit and the secondary tuning circuit are constructed in same structure, when it is called as just a 'tuning circuit', it means the primary circuit and the secondary tuning circuits, or the interstage tuning circuit 20.

The primary circuit on the left in FIG. 1 includes a first circuit K1 in which a first variable capacitor element 21a provided at a non-grand side and a second variable capacitor element 31a provided at a grand side (GND) are serially connected. An inductance element 23a is connected in parallel to the first circuit K1, whereby a resonance circuit is formed.

A first resistor 24a is connected between one end (terminal of the non-grand side) of the first variable capacitor element 21a and a tuning voltage terminal 28, and a second resistor 25a is connected between the connection point of the other end (terminal of the grand side) of the first variable capacitor element 21a and the second variable capacitor element 31a and the tuning voltage terminal 28.

Furthermore, a second circuit K2 in which a switch element 26a and a third resistor 27a with a resistance value Rb are serially connected is provided. The second circuit K2 is parallely connected to the first circuit K1 consisting of the first variable capacitor element 21a and the second variable capacitor element 31a.

Similarly, the secondary circuit on the right in FIG. 1 also includes a first circuit K1 in which a first variable capacitor element 21b provided at a non-grand side and a second variable capacitor element 31b provided at a grand side (GND) are serially connected. Further, an inductance element 23b is connected in parallel to the first circuit K1, whereby a resonance circuit is formed.

A first resistor 24b is connected between one end (terminal of the non-grand side) of the first variable capacitor element 21b and a tuning voltage terminal 28, and a second resistor 25b is connected between the connection point of the other end (terminal of the grand side) of the first variable capacitor element 21b and the second variable capacitor element 31b and the tuning voltage terminal 28.

Furthermore, the switch element 26b and the third resistor 27b with a resistance value Rb are serially connected each other, and are parallely connected to the first circuit K1 consisting of the first variable capacitor element 21b and the second variable capacitor element 31b.

As the first variable capacitor elements 21a and 21b and the second variable capacitor elements 31a and 31b, for example, a variable capacitor diode (varactor diode or varicap diode) is used.

Further, the first resistor 24a and the second resistor 25a of the primary circuit and the first resistor 24b and the second resistor 25b of the secondary circuit have the same resistance value Ra, and a common tuning voltage Vt is applied to the other end of each of the resistors 24a, 24b, 25a and 25b. Moreover, the first resistor (resistance value Ra) 24a and the third resistor (resistance value Rb) 27a are set by Ra>>Rb.

Further, a common band switching signal VB of a predetermined voltage is to be applied to the switch elements 26a and 26b. Moreover, in FIG. 1, the switch elements 26a and 26b are used as the MOS-type FET, but the bipolar-type transistor or a relay may be used. Further, in the first circuit K2 of the present embodiment, the switch elements 26a and 26b are provided at the non-grand side and the third resistors 27a and 27b are provided at the grand side, and they may be reversely provided.

Hereinafter, an operation of the tuning circuit will be described.

Here, since the operation of the primary circuit is same as that of the secondary tuning circuit, the primary circuit will be mainly described.

<VHF High Band Tuning>

In order to set the interstage tuning circuit 20 for a high band of VHF, the band switching signal VB of the predetermined voltage is transmitted to the switch element 26a, and the switch element 26a is set to conduction (ON) state. Then, the first resistor 24a and the third resistor 27a are connected via the switch element 26a, thus the anode voltage Va of the switch element 26a is set by a formula Va={Rb/(Ra+Rb)}·Vt defined by a resistance division of the first resistor 24a and the third resistor 27a. Meanwhile, a cathode voltage Vb of the switch element 26a is the tuning voltage Vt.

In this case, the relation between the anode voltage Va and cathode voltage Vb is set by Va<Vb, and the variable capacitor diode constituting the first variable capacitor element 21a is set to reversed-bias state.

The relation between the first resistor (resistance value Ra) 24a and the third resistor (resistance value Rb) 27a is set by Ra>>Rb. Accordingly, since the anode of the first variable capacitor element 21a becomes almost a grand potential, the tuning voltage Vt is applied between both ends of the first variable capacitor element 21a.

Meanwhile, the tuning voltage Vt is applied between the anode and the cathode of the second variable capacitor element 31a.

Accordingly, a composite capacitor C of the first circuit K1 becomes a serial connection capacitor of the capacitor of the first variable capacitor element 21a and the capacitor of the second variable capacitor element 31a, whereby it becomes smaller compared to the case of one variable capacitor element.

Here, when the composite capacitor C becomes smaller, since the tuning frequency f is set to the high band as shown in the formula of the resonance frequency of the resonance circuit f=(1/2p√L·C)), the interstage tuning circuit 20 can be switched to the high band of the high frequency.

Moreover, when the tuning voltage Vt is changed in this state, it is possible to tune to any one of channels in the high band.

<VHF Low Band Tuning>

Next, in order to set the interstage tuning circuit 20 for a low band of VHF, the band switching signal VB is switched, and the switch element 26a is set to non-conduction (off) state. Then, the same tuning voltage Vt is applied to both terminals of the anode and the cathode of the variable capacitor diode forming the first variable capacitor element 21a, thereby setting the potential difference between both terminals of the variable diode to 0 [v]. Thus, since an electrostatic capacitance of the first variable capacitor elements 21a and 21b becomes a maximum electrostatic capacitance Cmax, the composite capacitor C of the first variable capacitor element 21a and the second variable capacitor element 31a connected in series becomes large compared to the VHF high band tuning.

Therefore, the interstage tuning circuit 20 can be switched to the low band of low frequency as shown in the formula of the resonance frequency f=(1/2p√L·C)).

Moreover, when the tuning voltage Vt is changed in this state, it is possible to tune to any one of channels in the high band.

In the above-mentioned embodiment, an ON-resistor of the switch element 26a is connected to the inductance element 23a forming the parallel resonance circuit and the first circuit K1 (the first variable capacitor element 21a and the second variable capacitor element 31a) in parallel, and it is not serially connected to the inductance element 23a in the circuit as the conventional circuit. Thus, as the conventional circuit, it is possible to prevent a deterioration of the RF characteristic due to over-sized wideness of the band width BW during the high band tuning.

In addition, since reduction of the Q value of the tuning circuit can be prevented regardless of frequency bands, the RF characteristic can be improved by tuning in a constant bandwidth.

Figure 2:
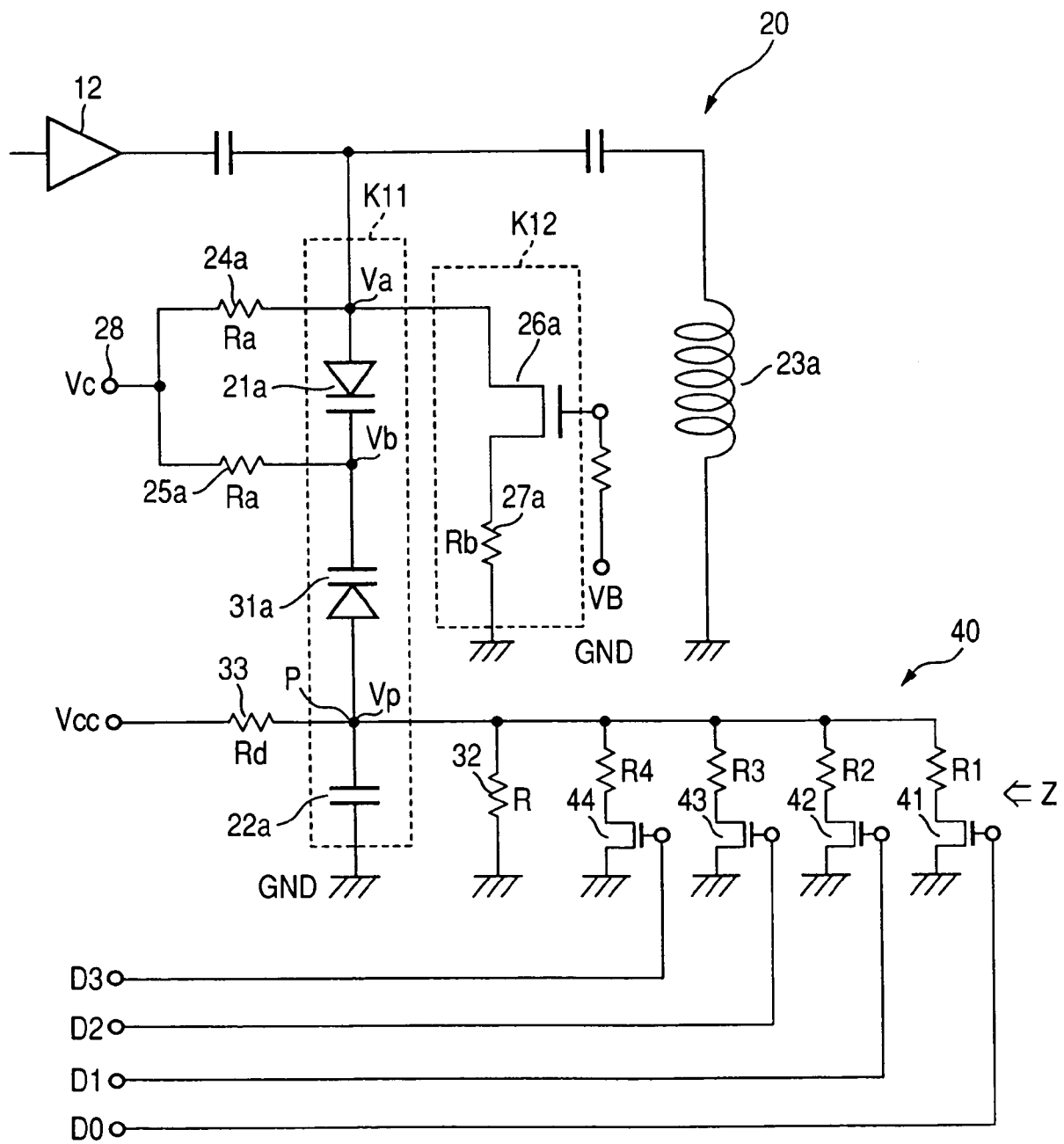
FIG. 2 is a circuit diagram showing a television a tuning circuit of a second embodiment of the present invention.

FIG. 2 is a circuit diagram showing a tuning circuit of a second embodiment of the present invention. FIG. 2 shows only a configuration of a modified primary circuit in FIG. 1, and a secondary circuit is omitted since it has same structure as the primary circuit. Further, the same members as the first embodiment will be descried with the same numerals.

As shown in FIG. 2, a tuning circuit 20B as a second embodiment includes a first circuit K11 in which a first variable capacitor element 21a subsequently lined up from a non-grand side to a grand side, a second variable capacitor element 31a and a capacitor 22a are serially connected. Also in this embodiment, the first variable capacitor element 21a and the second variable capacitor element 31a are all formed with the variable capacitor diode, and the cathodes of both ends thereof are connected to each other. The resonance circuit is formed by the first circuit K11 and the inductance element 23a which are parallely connected to each other.

The switch element 26a and the third resistor 27a with a resistance value Rb is serially connected, and the second circuit D12 is parallely connected to the first circuit K11 consisting of the first variable capacitor element 21a, the second variable capacitor element 31a and the capacitor 22a.

The first resistor 24a is connected between one end (terminal of the non-grand side) of the first variable capacitor element 21a and a tuning voltage terminal 28, and the second resistor 25a is connected between the connection point of the cathode of the first variable capacitor element 21a and the cathode of the second variable capacitor element 31a and the tuning voltage terminal 28. A common tuning voltage Vt is applied to the one end of the first and the second resistors 24a and 25a. Moreover, it is same as the first embodiment that the first resistor (resistance value Ra) 24a and the third resistor (resistance value Rb) 27a is exemplified as a formula Ra>>Rb.

The connection point P of the anode of the second variable capacitor element 31a and the capacitor 22a is a reference numeral P. The fourth resistor 32 consisted of the resistance value R is connected between the connection point P and the grand, that is, at both ends of the capacitor 22a. Further, the fifth resistor 33 consisted of the resistance value Rd which is connected to a power supply as described below is connected to the connection point P.

Further, a plurality of voltage control circuits are provided between the non-grand side and the grand side of the capacitor 22a. That is, each of a first voltage control circuit consisting of an control resistor R1 and a switching element 41 serially connected thereto, a second voltage control circuit consisted of an control resistor R2 and a switching element 42 serially connected thereto, a third voltage control circuit consisted of an control resistor R3 and a switching element 44 serially connected thereto and a fourth voltage control circuit consisting of an control resistor R4 and a switching element 44 serially connected thereto are parallely connected to the capacitor 22a and the fourth resistor 32.

Moreover, the fourth resistor 32, the fifth resistor 33 and the first or the fourth voltage control circuit constitute a tuning control circuit 40 as described below.

As described below, on each switching element 41 or 44 constituting the first or the fourth voltage control circuit, four bits control signals D0, D1, D2 and D4 consisting of a high level signal of a predetermined voltage level and a low level signal of, for example, 0 [v] are transmitted, thereby performing a conversion control for a conduction (on) or non-conduction (off) of the switching element 41 or 44.

An operation of the tuning circuit in the second embodiment will be described.

The operation of the tuning circuit shown in the second embodiment is same as the operation of the tuning circuit basically shown in the first embodiment.

That is, the switching operation of the low band and high band is performed by a band switching signal VB applicable to the switch element 26a. When the switch element 26a is set to conduction state (ON-state), a composite capacitor C of the first circuit K11 becomes a serial connection capacitor of the first variable capacitor element 21a and the second variable capacitor element 31a, and becomes smaller, whereby it is possible to switch the tuning circuit to a high band of a high frequency. On the other hand, when the switch element 26a is set to non-conduction state (OFF-state), unlike the conduction state, a capacitance of the first variable capacitor element 21a becomes large and the composite capacitor C of the first circuit K11 is almost same as the capacitor value of the second variable capacitor element 31a so that it becomes large since the high and tuning, whereby it is possible to switch the tuning circuit to a low band of a low frequency.

Moreover, by varying the tuning voltage Vt to the low band or high band state and tuning the voltage to any one of channels in the low band during the low band tuning, it becomes possible to tune to any one of channels in the high band during the high band tuning.

Next, an operation of the tuning control circuit 40 will be described.

A formula of R=R1=2·R2=4·R3=8·R4, in other words, R1=R, R2=R/2, R3=R/4, R4=R/8 is formed between each of control resistors R1 to R4 shown in FIG. 2.

When whole resistance value of the tuning control circuit 40 is set to Z, the whole resistance value Z can be set to those values in Table 1 by control signals D0, D1, D2 and D4 applicable to the switching elements 41 to 44. Moreover, in the Table 1, '0' represents the low level signal setting each of the switching elements to non-conduction state (OFF-state) and '1' represents the high level signal setting the elements to conduction state (ON-state).

TABLE 1

| D3 | D2 | D1 | D0 | Z |
|---|---|---|---|---|
| 0 | 0 | 0 | 0 | R |
| 0 | 0 | 0 | 1 | R//R1 = R/2 |
| 0 | 0 | 1 | 0 | R//R2 = 2R/3 |
| 0 | 0 | 1 | 1 | R//R1//R2 = 2R/5 |
| 0 | 1 | 0 | 0 | R//R3 = 4R/5 |
| 0 | 1 | 0 | 1 | R//R1//R3 = 4R/9 |
| 0 | 1 | 1 | 0 | R//R2//R3 = 4R/7 |
| 0 | 1 | 1 | 1 | R//R1//R2//R3 = 4R/11 |
| 1 | 0 | 0 | 0 | R//R4 = 8R/9 |
| 1 | 0 | 0 | 1 | R//R1//R4 = 8R/17 |
| 1 | 0 | 1 | 0 | R//R2//R4 = 8R/13 |
| 1 | 0 | 1 | 1 | R//R1//R2//R4 = 8R/21 |
| 1 | 1 | 0 | 0 | R//R3//R4 = 8R/11 |
| 1 | 1 | 0 | 1 | R//R1//R3//R4 = 8R/19 |
| 1 | 1 | 1 | 0 | R//R2//R3//R4 = 8R/15 |
| 1 | 1 | 1 | 1 | R//R1//R2//R3//R4 = 8R/23 |

As described above, the switch operation of each the switching elements 41, 42, 43 and 44 is switched by transmitting the control signals D0, D1, D2 and D4 of the table 1 to the switching elements 41, 42, 43 and 44, thus the whole resistance value Z of the tuning control circuit 40 can be gradually set. Moreover, the control signals D0, D1, D2 and D4 are transmitted from a control section not shown.

Here, the serial potential of the connection point P is transmitted by Vp, and a predetermined voltage Vcc is applied to one end of the fifth resistor 33, thus the potential Vp is defined by a formula $Vp=\{Z/(Rd+Z)\} \cdot Vcc$.

In addition, by transmitting the control signals D0, D1, D2 and D4 as shown in FIG. 1, the potential Vp of the connection point P (anode potential of the second variable capacitor element 31a) can be gradually varied.

Accordingly, even when a manufacturing process of each elements such as the capacitor constituting the resonance circuit, the variable capacitor element and the inductance is unstable and a desired characteristic can not be achieved, it is possible to obtain a desired tuning characteristic by transmitting the control signals D0, D1, D2 and D4 to each switching elements 41 to 44 of the first to the fourth voltage control circuits constituting the tuning control circuit 40 to adjust the value of the composite capacitor C constituting the resonance circuit.

In the above mentioned embodiment, the respective switching elements 41 to 44 are formed as the MOS-type FET, but the bipolar-type transistor or using a relay is also preferred.

Further, the respective switching elements 41 to 44 are formed by a structure providing the switching elements on the grand side and the control resistors R1 on the non-grand side, but the reversed structure may be adapted.

The invention claimed is:

1. A tuning circuit comprising, at least:
    a first circuit which serially connects a first variable capacitor element and a second variable capacitor element;
    an inductance element which is parallely connected to the first circuit and constitutes a resonance circuit with the first circuit;
    a second circuit which includes a switch element and a third resistor serially connected to each other and is parallely connected to the first circuit; and
    a first resistor and a second resistor which are connected to both ends of the first variable capacitor element, respectively and apply a predetermined tuning voltage.

2. The tuning circuit according to claim 1, further comprising a tuning control circuit which corrects variation in the resonance circuit element by varying the voltage applied to one end of the second variable capacitor element.

3. The tuning circuit according to claim 1, wherein the first resistor and the second resistor have the same resistance values.

4. The tuning circuit according to claim 1, wherein the variable capacitor element is a variable capacitor diode.

5. The tuning circuit according to claim 1, wherein the switch element is a MOS-type FET or a bipolar-type transistor.

6. The tuning circuit according to claim 2, wherein the tuning control circuit comprises a fourth resistor connected in parallel to the capacitor, a plurality of voltage control circuits formed by parallely connecting switching elements and control resistors different from every circuit, and a fifth resistor applying a predetermined voltage to connection points of the second variable capacitor element and the fourth resistor and the plurality of the voltage control circuit.

7. The tuning circuit according to claim 6, wherein a switching operation of the respective switching elements provided in the plurality of voltage control circuit is performed by a control signal of a predetermined bit number.

* * * * *